(12) United States Patent
Watanabe (10) Patent No.: US 10,236,713 B2
(45) Date of Patent: Mar. 19, 2019

(54) MONITOR HOUSING APPARATUS

(71) Applicant: Panasonic Intellectual Property Management Co., Ltd., Osaka-shi, Osaka (JP)

(72) Inventor: Kou Watanabe, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 453 days.

(21) Appl. No.: 14/649,208

(22) PCT Filed: Nov. 27, 2013

(86) PCT No.: PCT/JP2013/006962
§ 371 (c)(1),
(2) Date: Jun. 3, 2015

(87) PCT Pub. No.: WO2014/155449
PCT Pub. Date: Oct. 2, 2014

(65) Prior Publication Data
US 2015/0311748 A1    Oct. 29, 2015

(30) Foreign Application Priority Data
Mar. 25, 2013  (JP) .................... 2013-061730

(51) Int. Cl.
*H02J 9/06*  (2006.01)
*B64D 11/00*  (2006.01)
(Continued)

(52) U.S. Cl.
CPC ............ *H02J 9/06* (2013.01); *B64D 11/0015* (2013.01); *H02J 1/108* (2013.01); *H02J 7/345* (2013.01);
(Continued)

(58) Field of Classification Search
CPC ............... H02J 9/06; H02J 1/108; H02J 7/345
(Continued)

(56) References Cited

U.S. PATENT DOCUMENTS

| 6,256,078 B1 | 7/2001 | Ogata |
| 7,424,351 B2 | 9/2008 | Noguchi |

(Continued)

FOREIGN PATENT DOCUMENTS

| JP | 2000-159197 A | 6/2000 |
| JP | 2002-234401 A | 8/2002 |

(Continued)

OTHER PUBLICATIONS

PCT International Search Report of Int'l Appln. No. PCT/JP2013/006962 dated Jan. 21, 2014.

*Primary Examiner* — Alfonso Perez Borroto
(74) *Attorney, Agent, or Firm* — Shinjyu Global IP (57) ABSTRACT

A monitor housing apparatus comprises an opening and closing mechanism, a drive motor, a power supply, a backup capacitor, a contact switch, and a controller. The opening and closing mechanism turns a monitor around a rotation shaft. The power supply supplies electrical power to the drive motor. The backup capacitor supplies power to the drive motor in the event that the supply of power from the power supply to the drive motor is shut off. The controller applies voltage to the backup capacitor when the contact switch detects that the monitor is in its deployed state, and halts the application of voltage from the power supply to the backup capacitor when the contact switch detects that the monitor is in its stowed state.

6 Claims, 9 Drawing Sheets

(51) Int. Cl.
*H05K 5/00* (2006.01)
*H05K 5/02* (2006.01)
*H02J 1/10* (2006.01)
*H02J 7/34* (2006.01)
*H04N 5/64* (2006.01)
*H04N 21/414* (2011.01)

(52) U.S. Cl.
CPC ............ *H02J 9/061* (2013.01); *H05K 5/0017* (2013.01); *H05K 5/0226* (2013.01); *H04N 5/64* (2013.01); *H04N 21/41415* (2013.01); *H04N 21/41422* (2013.01)

(58) Field of Classification Search
USPC .......................................................... 307/64
See application file for complete search history.

(56) References Cited

U.S. PATENT DOCUMENTS

| | | | |
|---|---|---|---|
| 8,665,382 B1* | 3/2014 | Sugimoto | .............. F16M 11/10 248/323 |
| 2005/0190467 A1 | 9/2005 | Noguchi | |
| 2009/0251624 A1* | 10/2009 | Ikunami | .............. B60R 11/0235 348/837 |

FOREIGN PATENT DOCUMENTS

| JP | 2003-269213 A | 9/2003 |
|---|---|---|
| JP | 2005-239086 A | 9/2005 |

\* cited by examiner

MONITOR HOUSING APPARATUS

PRIORITY

This application is a U.S. National stage application of International Application PCT/JP2013/006962, with an international filing date of Nov. 27, 2013, which claims priority to Japanese Patent Application No. 2013-061730 filed on Mar. 25, 2013. The entire disclosures of International Application PCT/JP2013/006962 and Japanese Patent Application No. 2013-061730 are hereby incorporated herein by reference.

TECHNICAL FIELD

Embodiments of the present invention relate to a monitor housing apparatus for storing an opening and closing monitor installed in the ceiling portion of the passenger compartment of a passenger aircraft or the like.

BACKGROUND

Monitor devices for providing service to passengers in the form of displaying video, etc., have been installed in recent years in the passenger compartments of passenger aircraft, trains, buses, passenger boats, and other such means of transport.

In particular, on a passenger aircraft, a stowable monitor is attached in a rotatable state to the lower part of the overhead compartment above the passenger seat (see Patent Literature 1).

From the standpoint of safety, it is the consensus that a ceiling stowage type of monitor that is installed in a passenger aircraft or the like must be stowed away in the overhead portion even if the supply of power from the aircraft is cut off during an emergency.

Therefore, a conventional monitor housing apparatus comprises an opening and closing mechanism directly linked to a flat spiral spring, as a mechanism for opening and closing the monitor. When the monitor is deployed, the force of the opening monitor winds the flat spiral spring, so during an emergency the repulsive force of the flat spiral spring is used to stow the monitor in the overhead portion.

Patent Literature 1: Japanese Laid-Open Patent Application 2000-159197 (laid open on Jun. 13, 2000)

SUMMARY

However, the following problems were encountered with the above-mentioned conventional monitor housing apparatus.

With the monitor housing apparatus disclosed in the above-mentioned publication, since a flat spiral spring is provided to the opening and closing monitor for stowing away the monitor in the event of an emergency, a gearbox with a high gear ratio or a power motor with enough drive force to open the monitor against the force of the flat spiral spring is required every time the monitor is deployed.

It is also possible, as another means for solving this problem, to install a capacitor or the like capable of storing up power for serving as an emergency power supply to the motor should the supply of power be cut off from the power supply that supplies power to the motor that drives the monitor.

However, because of the characteristics of a capacitor, when charging voltage is applied for a long time, there is the risk that age deterioration will diminish the capacitor performance.

It is an object of certain embodiments of the present invention to provide a monitor housing apparatus with which the service life of the capacitor installed for emergency power supply use is extended as long as possible, without making the structure too complicated.

The monitor housing apparatus disclosed herein is used for storing a monitor in a stowed position, which monitor is installed in a housing component provided to the ceiling, in a state of being able to open and close, said monitor housing apparatus comprising an opening and closing mechanism, a drive motor, a power supply, a capacitor, a detector, and a voltage application controller. The opening and closing mechanism turns the monitor around a rotation shaft that serves as the rotational center when the monitor is opened and closed. The drive motor supplies the opening and closing mechanism with drive force for opening and closing the monitor. The power supply supplies electrical power to the drive motor. The capacitor supplies the drive motor with power in the event that the supply of power from the power supply to the drive motor is shut off. The detector detects when the monitor has been deployed. The voltage application controller applies voltage from the power supply to the capacitor when the detector detects that the monitor is in its deployed state, and halts the application of voltage from the power supply to the capacitor when the detector detects that the monitor is in its stowed state.

Here, with a monitor housing apparatus in which are installed a drive motor for opening and closing the monitor upon receiving power from the power supply, and a capacitor for supplying emergency power when the supply of power from the power supply is shut off, the detector detects a state in which the monitor has been deployed, and voltage is applied from the power supply to the capacitor.

The phrase "a state in which the monitor has been deployed" here encompasses not only a visibly fully closed state, but also a state that is in between a fully closed state and a fully open state. Also, the phrase "the detector detects a state in which the monitor has been deployed" may refer to indirectly detecting a state in which the monitor has been deployed by detecting that the monitor is in a fully closed state, or to directly detecting a state in which the monitor has been deployed by detecting the angle, position, etc., of the monitor.

Consequently, during an emergency, etc., when the supply of power from the power supply has been shut off, voltage is applied from the power supply to the capacitor when the monitor is in its deployed state, so the monitor can be reliably moved from its deployed state to its fully closed state. Also, since the application of voltage from the power supply to the capacitor is performed in the deployed state of the monitor, the length of time during which voltage is applied to the capacitor can be kept to a minimum.

As a result, the service life of the capacitor installed for emergency power supply use can be extended over that in the past, without making the structure too complicated.

With the monitor housing apparatus disclosed herein, the service life of the capacitor installed for emergency power supply use can be extended as long as possible, without making the structure too complicated.

DETAILED DESCRIPTION

Embodiments will now be described in detail through reference to the drawings as needed. However, some unnecessarily detailed description may be omitted. For example, detailed description of already known facts or redundant description of components that are substantially the same may be omitted. This is to avoid unnecessary repetition in the following description, and facilitate an understanding on the part of a person skilled in the art.

The applicant has provided the appended drawings and the following description so that a person skilled in the art might fully understand this disclosure, but does not intend for these to limit what is discussed in the patent claims.

Then monitor housing apparatus pertaining to an embodiment of the present invention will now be described through reference to FIGS. 1A to 8.

Figure 1A:
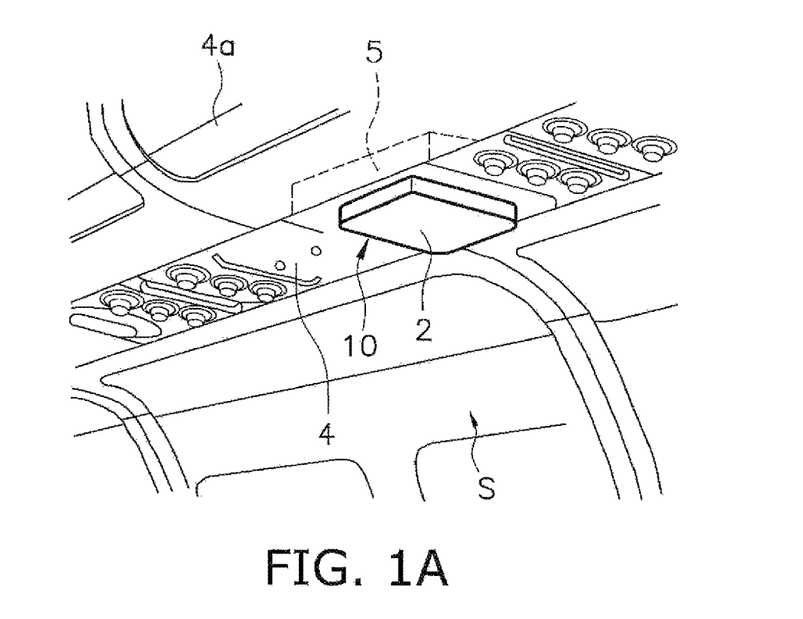
FIG. 1A is an oblique view of a state in which the monitor housing apparatus pertaining to an embodiment of the present invention is installed in the passenger compartment of a passenger aircraft, and the monitor is in its closed state.
Figure 1B:
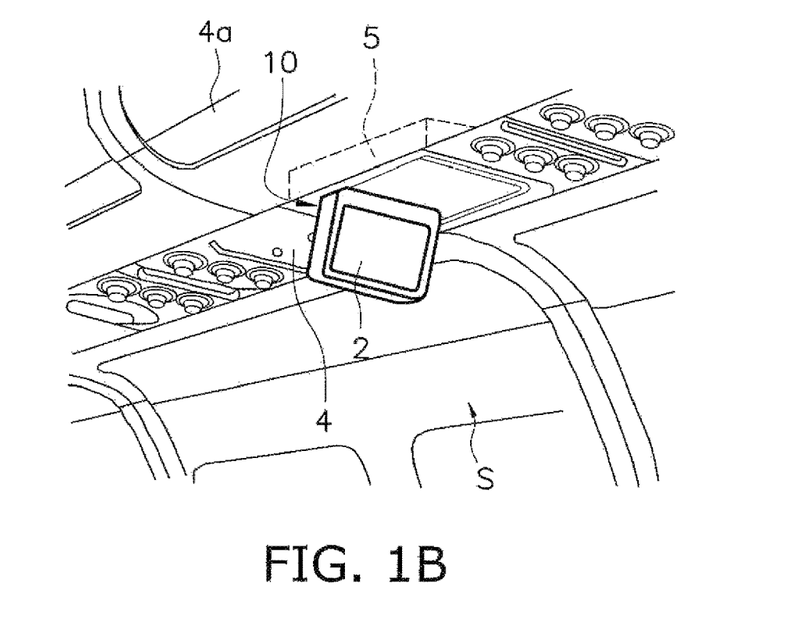
FIG. 1B is an oblique view of the state when the monitor is being used.

As shown in FIGS. 1A and 1B, the monitor housing apparatus 10 pertaining to this embodiment is provided in order to open and close an opening and closing monitor 2 that is stored in a housing component 5 provided to a ceiling 4 of a passenger compartment S of a passenger aircraft, and more particularly, under an overhead compartment 4a that is installed in the ceiling 4 and can be opened and closed.

Monitor 2

The monitor 2 turns around a rotation shaft 3 (see FIG. 2) formed near the upper end in a fully open state (usage state), and thereby opens and closes (see FIG. 2) between a stowed state in which it is parallel to the plane of the housing component 5 provided as part of the ceiling 4 as shown in FIG. 1A (fully closed state), and a usage state in which it has been opened by about 110 degrees with respect to the plane of the housing component 5 (fully open state) as shown in FIG. 1B.

Figure 2:
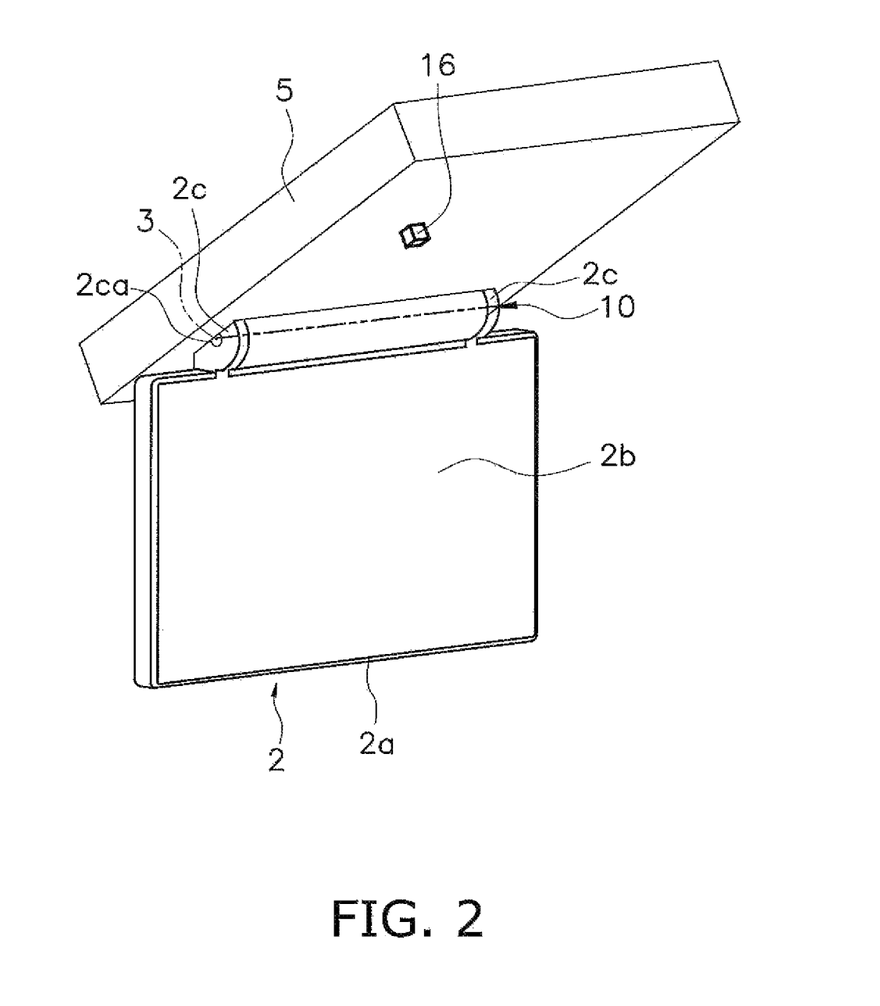
FIG. 2 is an oblique view of the configuration of the monitor and monitor housing apparatus in the usage state in FIG. 1B.
Figure 3:
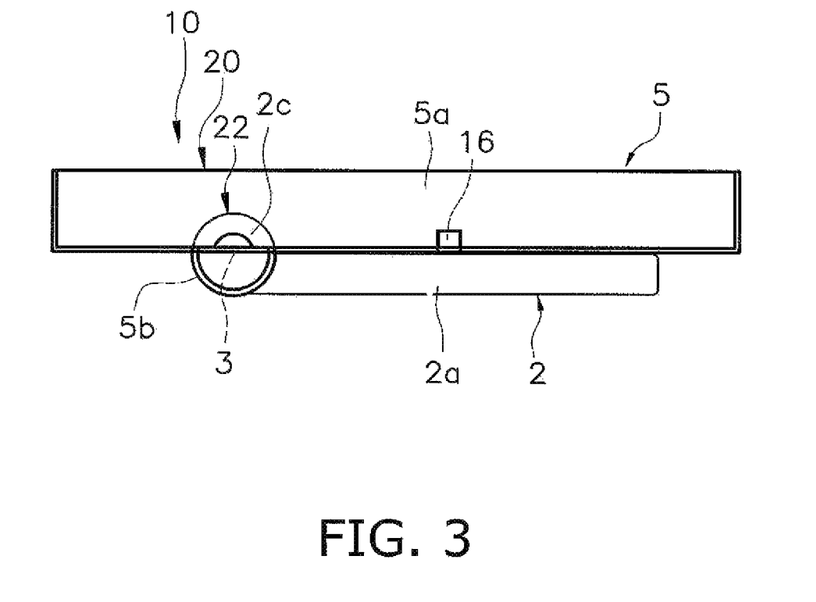
FIG. 3 is a side view of the configuration of the monitor and monitor housing apparatus in the closed state in FIG. 1A.

As shown in FIGS. 2 and 3, the monitor 2 has a monitor body 2a, a display screen 2b, and cylindrical parts 2c.

As shown in FIG. 2, the monitor body 2a has a substantially square shape in front view.

The display screen 2b is a display panel featuring an LCD (liquid crystal display), and is provided in order to display video and the like toward the passenger in the fully open state.

The cylindrical parts 2c are provided on the left and right sides along the edge on the rotation shaft 3 side of the monitor body 2a, and are substantially circular in shape. As shown in FIG. 2, holes 2ca into which the rotation shaft 3 is inserted are formed in the center portions of the cylindrical parts 2c. Consequently, the monitor 2 turns between its fully closed state and its fully open state while the cylindrical parts 2c are axially supported by the rotation shaft 3.

The monitor 2 is driven open and closed by the rotary drive force of a drive motor 22 of an opening and closing mechanism 20 included in the monitor housing apparatus 10 (discussed below).

Housing Component 5

As shown in FIGS. 1A and 1B, the housing component 5 is provided to part of the ceiling 4 of the passenger compartment S of a passenger aircraft, and the monitor housing apparatus 10 used to open and close the monitor 2 is attached.

Figure 4:
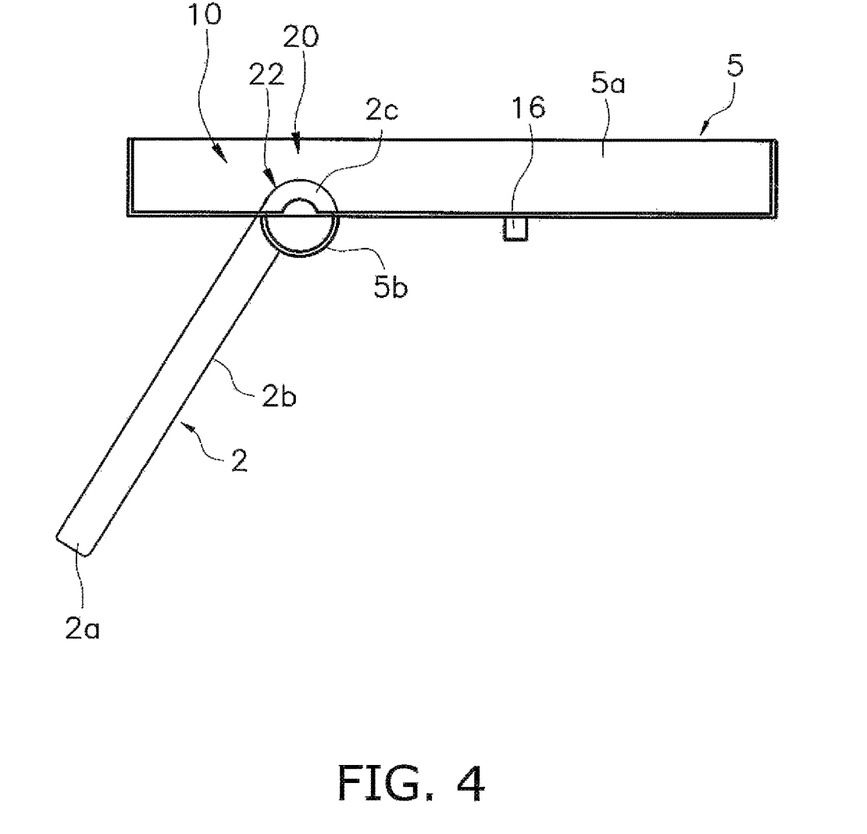
FIG. 4 is a side view of the configuration of the monitor and monitor housing apparatus in the open state in FIG. 1A.

As shown in FIGS. 3 and 4, the housing component 5 has a housing component body 5a and grooves 5b.

The housing component body 5a houses the monitor housing apparatus 10 (discussed below) in a box-shaped internal space.

As shown in FIGS. 3 and 4, the grooves 5b are substantially semicircular in a side cross section view, and the drive motor 22, etc., of the monitor housing apparatus 10 (discussed below) are fixed and disposed so that the substantially cylindrical outer peripheral face mates.

Monitor Housing Apparatus 10

The monitor housing apparatus 10 is provided at a position where the housing component 5 and the monitor 2 are connected, in order to open and close the monitor 2. As shown in FIGS. 3 and 4, the monitor housing apparatus 10 comprises the opening and closing mechanism 20 and the drive motor 22.

The opening and closing mechanism 20 receives the rotary drive force of the drive motor 22 and turns the monitor 2 around the rotation shaft 3, and has a plurality of gears (not shown) in its interior.

The drive motor 22 is a drive source that produces a rotary drive force for opening and closing the monitor 2, and is fixed and disposed in the grooves 5b formed in the left and right cylindrical parts 2c of the monitor 2. The drive motor 22 transmits rotary drive force directly to the cylindrical parts 2c of the monitor 2 via a plurality of gears included in the opening and closing mechanism 20, thereby opening and closing the monitor 2 between the fully closed state shown in FIG. 3 and the fully open state (usage state) shown in FIG. 4.

In the fully open state shown in FIG. 4, the monitor 2 is held in this state by the short braking function of the drive motor 22.

As discussed above, the monitor housing apparatus 10 in this embodiment is installed in the passenger compartment S of a passenger aircraft. Therefore, even if the supply of power from the aircraft (a power supply 11) should be cut off during an emergency for some reason, there may be times when, for the sake of safety, the monitor 2 that is in its usage state must be moved from the fully open state shown in FIG. 1B to the fully closed state (stowed state) sown in FIG. 1A. Also, even if the power supply should be cut off while the monitor 2 is being moved from its fully closed state to its fully open state, again for the sake of safety, there may be times when the monitor 2 that is in its usage state must be moved to its fully closed state (stowed state).

In view of this, the monitor housing apparatus 10 further comprises the power supply 11, a detection circuit 12, a backup capacitor 13, a controller (voltage application controller) 14, a motor driver 15, a contact switch 16, and switches SW1 to SW3, as a mechanism for moving the monitor 2 to its fully closed state in the event that the power supply is cut off in a state in which the monitor 2 has been deployed.

The power supply 11 supplies power to the drive motor 22 during normal operation. Thus, when the monitor 2 is moved from its fully closed state to its fully open state at startup, and when the monitor 2 is moved from its fully open state to its fully closed state when the aircraft is preparing to take off or land, power is supplied from the power supply 11 to the drive motor 22 that drives the monitor 2, as the normal operation shown in FIG. 6A.

Figure 5:
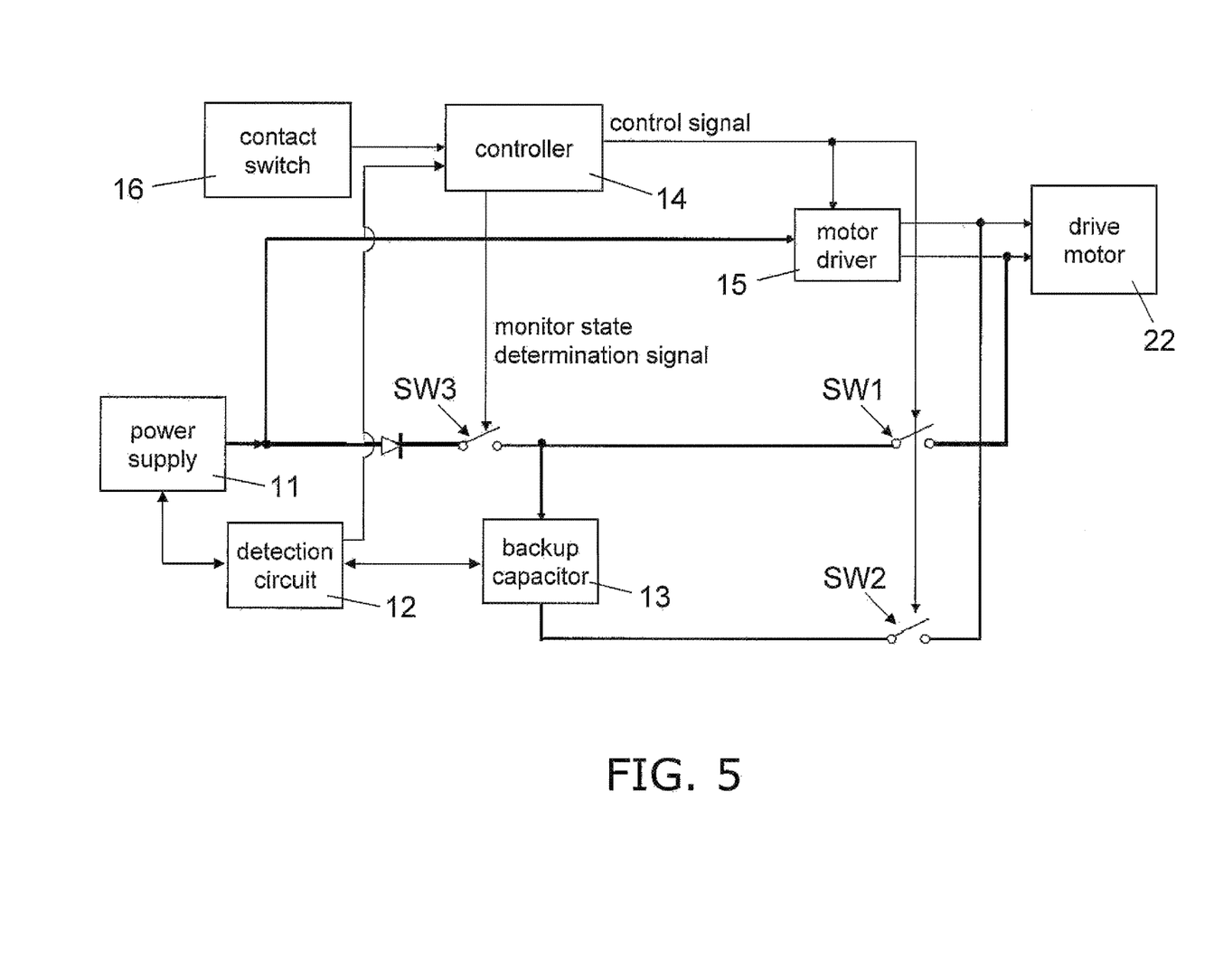
FIG. 5 is a control block diagram of the monitor housing apparatus shown in FIG. 2, etc.

As shown in FIG. 5, the detection circuit 12 is connected to the power supply 11 and the backup capacitor 13, and detects whether or not power is being supplied from the power supply 11. If the detection circuit 12 detects that the supply of power from the power supply 11 has been cut off, power is supplied from the backup capacitor 13 to the drive motor 22 as shown in FIG. 6B.

Figure 6A:
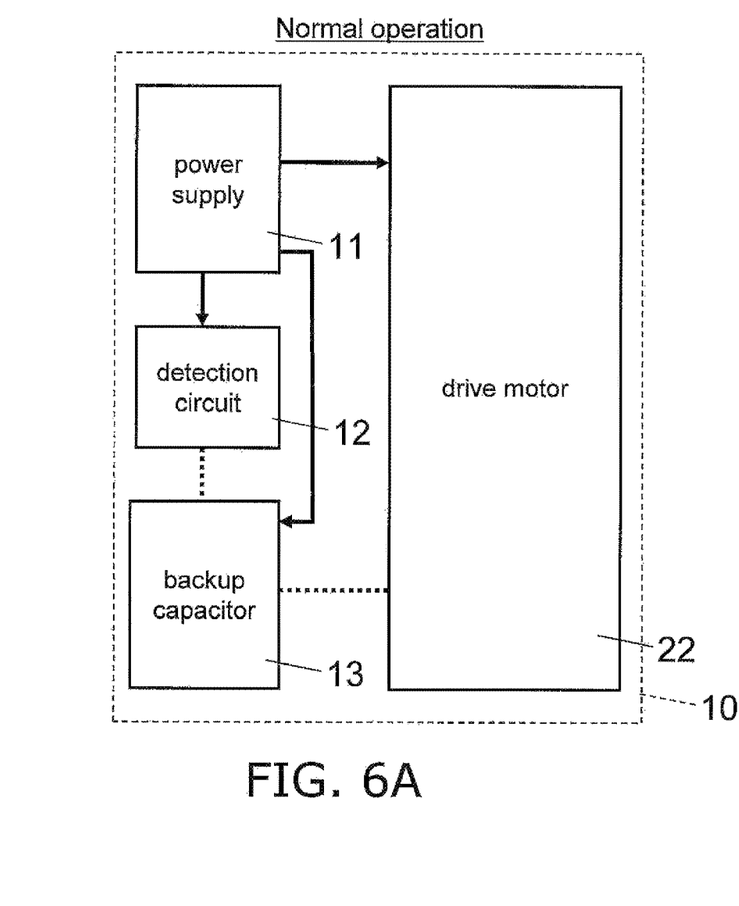
FIG. 6A is a block diagram of the power supply state during use (during normal operation) as shown in FIG. 1B.
Figure 6B:
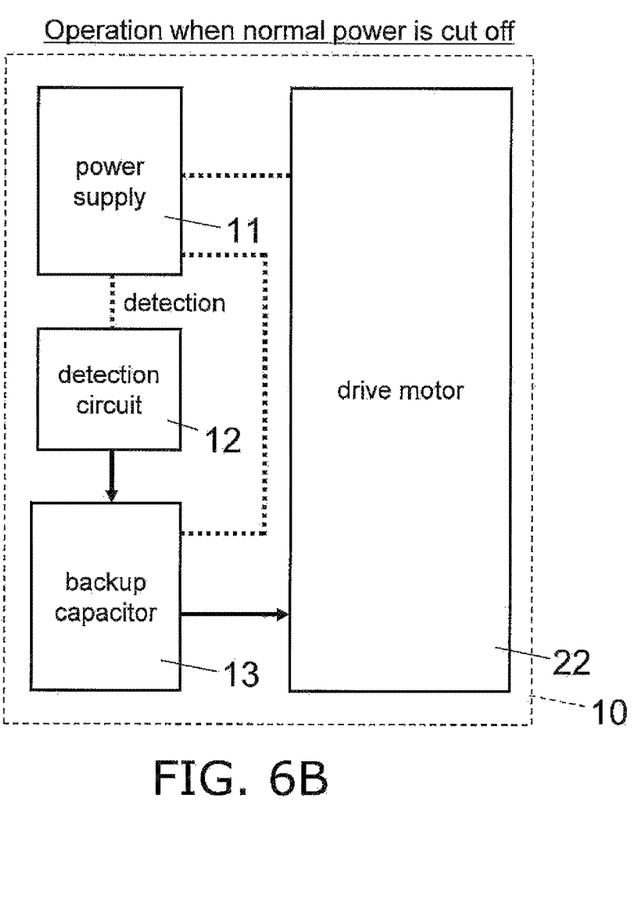
FIG. 6B is a block diagram of the power supply state when the supply of normal power has been shut off during use as shown in FIG. 1B.

As shown in FIGS. 5 and 6A, the backup capacitor 13 power is stored by applying voltage from the power supply 11. The backup capacitor 13 then supplies emergency power to the drive motor 22 when the supply of power from the power supply 11 to the drive motor 22 is cut off. Consequently, with the monitor housing apparatus 10 in this embodiment, even if the supply of power from the power supply 11 should be cut off from some reason, the deployed monitor 2 can be moved to its fully closed state by supplying the emergency power stored in the backup capacitor 13 to the drive motor 22.

The timing at which voltage is applied from the power supply 11 to the backup capacitor 13 is controlled by the controller 14.

More specifically, the controller 14 puts the switch SW3 in its on position based on the detection result of the contact switch 16 (discussed below), and voltage is applied from the power supply 11 to the backup capacitor 13. The conditions under which voltage is applied to the backup capacitor 13 will be discussed in detail below.

As shown in FIG. 5, the controller 14 determines whether or not to apply voltage from the power supply 11 to the backup capacitor 13 according to the development state of the monitor 2 as detected by the contact switch 16, and controls the opening and closing of the switches SW1 to SW3. The controller 14 also controls the drive motor 22 that deploys the monitor 2 by controlling the motor driver 15.

The motor driver 15 receives a control signal from the controller 14 to drive the drive motor 22.

As shown in FIG. 2, the contact switch 16 is installed in a state in which it can stick out from the face of the housing component 5, which constitutes part of the face of the ceiling 4 of the passenger compartment S opposite the face of the monitor 2 in its stowed state. As shown in FIG. 3, in the fully closed state in which the monitor 2 is stowed, the contact switch 16 moves to a retracted position (recessed state) (on state) in which it is in contact with part of the monitor 2, thereby detecting that the monitor 2 is in its fully closed state, that is, that the monitor 2 is not deployed.

As shown in FIG. 4, when the monitor 2 has been deployed, the contact switch 16 moves from to its retracted position (recessed state) to a state of sticking out (off state) in which it is in contact with part of the monitor 2, thereby detecting that the monitor 2 is in its deployed state, that is, that the monitor 2 has been deployed.

As shown in FIG. 5, the switch SW1 is provided between the power supply 11 and the drive motor 22, and is opened and closed by a control signal sent from the controller 14. The switch SW1 is normally open (off), and is closed (on) when the power supply is cut off (during an emergency).

As shown in FIG. 5, the switch SW2 is provided between the backup capacitor 13 and the drive motor 22, and just like the switch SW1, is opened and closed by a control signal from the controller 14. The switch SW2 is also similar to the switch SW1 in that normally it is open (off), and is closed (on) when the power supply is cut off (during an emergency).

As shown in FIG. 5, the switch SW3 is provided between the power supply 11 and the backup capacitor 13, and is opened and closed by a monitor state determination signal sent from the controller 14. That is, when the monitor state determination signal indicates that the monitor 2 is in its deployed state, the switch SW3 is closed (on), and voltage is applied from the power supply 11 to the backup capacitor 13. Thus, the switch SW3 switches the supply and cutoff of power from the power supply 11 to the drive motor 22 according to the state of deployment of the monitor.

Consequently, the controller 14 can determine whether or not the monitor 2 is in its deployed state according to the detection result of the contact switch 16. The controller 14 can then change the type of monitor state determination signal according to the deployment state of the monitor 2, and can control the opening and closing of the switch SW3.

As a result, voltage is applied from the power supply 11 to the backup capacitor 13 only when the contact switch 16 has detected that the monitor 2 is not in its fully closed state, that is, that the monitor 2 is in its deployed state. Thus, power for driving the drive motor 22 in an emergency is stored in the backup capacitor 13 only when the monitor 2 is deployed, so the length of time the voltage is applied can be reduced. Therefore, the service life of the backup capacitor 13 can be extended as compared to conventional usage.

Conditions for Applying Voltage to Backup Capacitor 13

With the monitor housing apparatus 10 in this embodiment, the backup capacitor 13 is provided as an emergency power supply for supplying power to move the monitor 2 to its fully closed state during an emergency, such as when the supply of power from the power supply 11 is stopped. The conditions under which voltage is applied from the power supply 11 to the backup capacitor 13 are set as follows in order to suppress the decrease in performance caused by age deterioration of the backup capacitor 13.

Specifically, in this embodiment, the backup capacitor 13 stores the voltage applied by the power supply 11 only when the monitor 2 is deployed.

On the other hand, the application of voltage from the power supply 11 to the backup capacitor 13 is stopped in the fully closed state in which the monitor 2 is stowed. The application of voltage to the backup capacitor 13 remains stopped until the next instruction to deploy the monitor 2.

That is, in this embodiment, a state in which the monitor 2 has been deployed is set as a condition for applying voltage to the backup capacitor 13.

Consequently, in state in which the monitor 2 has been deployed (including during a transition from a fully closed state to a fully open state, and during a transition from a fully open state to a fully closed state), this always results in a state in which voltage has been applied to the backup capacitor 13. Thus, in a state in which the monitor 2 is not fully closed, even in an emergency when the supply of power from the power supply 11 to the drive motor 22 has been stopped, the power stored in the backup capacitor 13 can be reliably used to change the monitor 2 to its fully closed state.

As a result, the monitor 2 can be changed to its fully closed state in an emergency, without employing any complicated configuration, and the length of time that voltage is applied to the backup capacitor 13 can be shortened, thus extending the service life of the backup capacitor 13.

The above-mentioned state in which the monitor 2 has been deployed includes the state while the monitor 2 is in the middle of changing from its fully closed state to its fully open state, or from its fully open state to its fully closed state.

Operation of Monitor Housing Apparatus 10

Normal Operation

Figure 7:
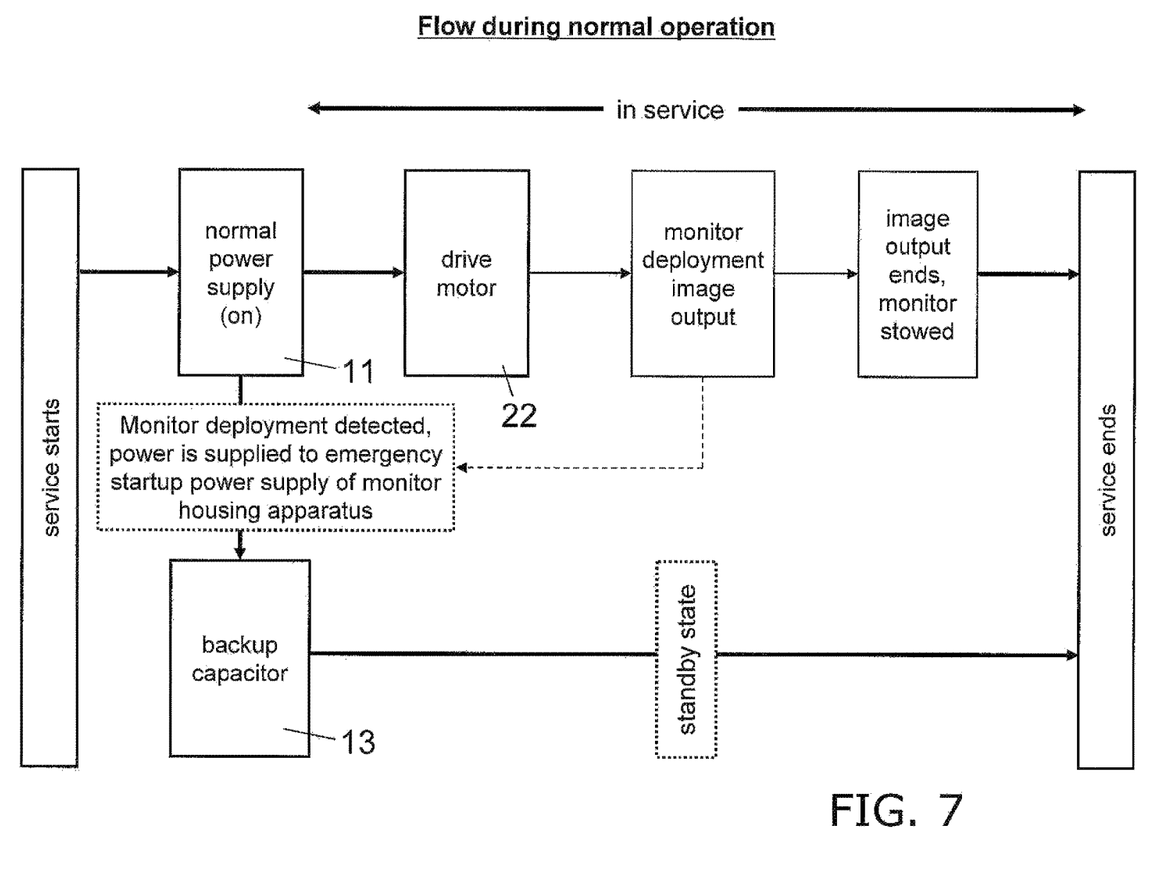
FIG. 7 is a flowchart during normal operation of this monitor housing apparatus.

As shown in FIG. 7, with the monitor housing apparatus 10 in this embodiment, image output and the opening and closing of the monitor 2 by the drive motor 22 that has received power from the power supply 11 are performed during normal operation.

The power supply 11 starts supplying power to the drive motor 22 to open or close the monitor 2 at the startup of the monitor housing apparatus 10, and applies voltage to the backup capacitor 13 according to the deployment state of the monitor 2 as detected by the contact switch 16.

More specifically, the controller 14 causes voltage to be applied from the power supply 11 to the backup capacitor 13 when the contact switch 16 is off, that is, when it is detected that the monitor 2 is in a deployed state.

Conversely, the controller 14 stops the application of voltage from the power supply 11 to the backup capacitor 13 when the contact switch 16 is on, that is, when it is detected that the monitor 2 is in its fully closed state.

Consequently, voltage is applied from the power supply 11 to the backup capacitor 13 for a shorter length of time as compared to a case when voltage is always being applied, so the service life of the backup capacitor 13 can be extended over that in the past.

Emergency Operation

Figure 8:
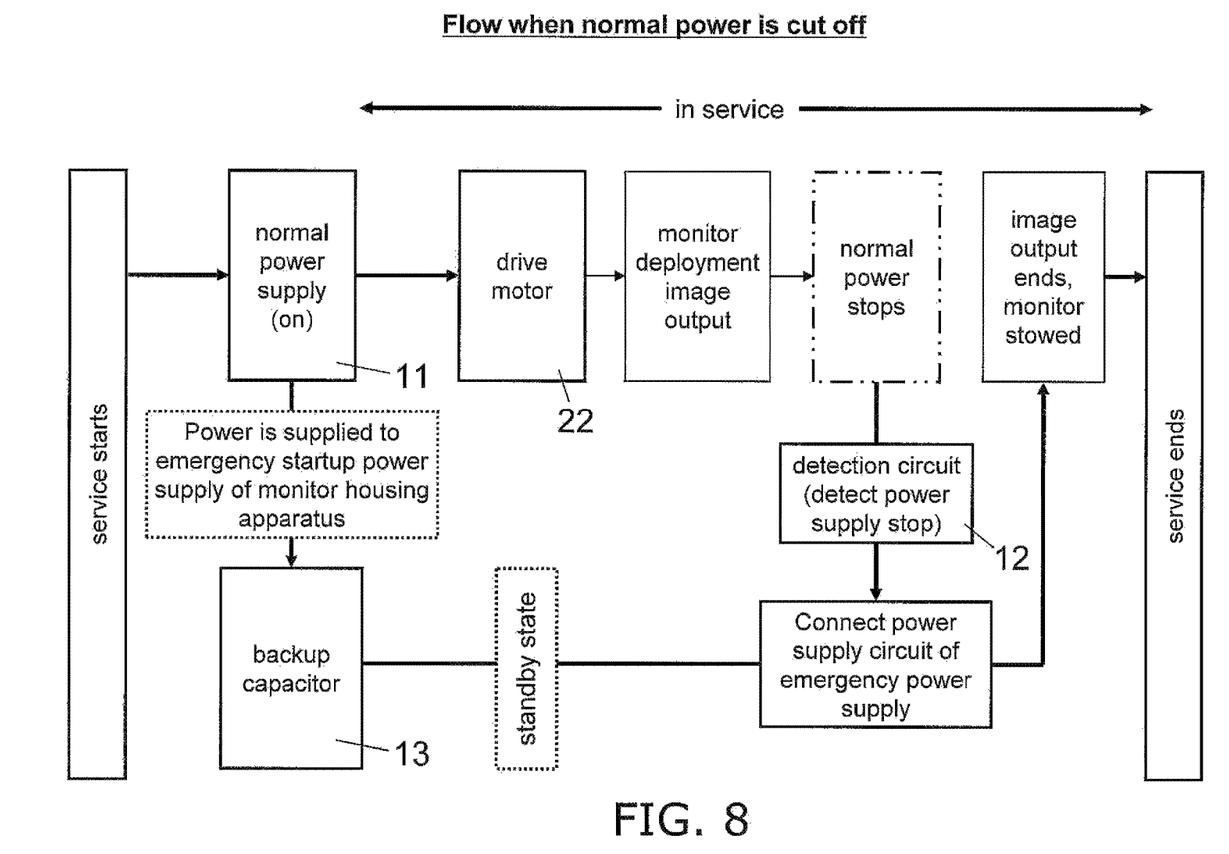
FIG. 8 is a flowchart during an emergency when the normal power supply of this monitor housing apparatus has been shut off.

As shown in FIG. 8, with the monitor housing apparatus 10 in this embodiment, when the supply of power from the power supply 11 is cut off, the detection circuit 12 detects that the power that was being supplied to the drive motor 22 or the monitor 2 has been cut off.

At this point, since the backup capacitor 13 is charged with voltage applied from the power supply 11 in a state in which the monitor 2 is deployed, there is a change from a standby state for power supply, to an emergency state of supplying power to the drive motor 22.

More specifically, the controller 14 starts the supply of power from the backup capacitor 13 to the drive motor 22 when the detection circuit 12 detects that the supply of power from the power supply 11 has stopped and that the contact switch 16 is off, that is, that the monitor 2 is in its deployed state.

Thus, even if the supply of power from the power supply 11 to the drive motor 22 should be cut off while the monitor 2 is in use (see FIG. 1B) or while the monitor 2 is being deployed, emergency power can be automatically supplied from the backup capacitor 13 (serving as an emergency power supply) to the drive motor 22. Therefore, the drive motor 22 can be reliably driven so that the monitor 2 is returned to its fully closed state (see FIG. 1A).

Other Embodiments

An embodiment of the present invention was described above, but the present invention is not limited to or by the above embodiment, and various modifications are possible without departing from the gist of the invention.

(A)

In the above embodiment, an example was described in which the contact switch 16 provided to the ceiling 4 of the passenger compartment S of an aircraft was used as a detector for detecting the deployed state of the monitor 2. However, embodiments of the present invention are not limited to this.

In addition to the contact switch 16, the above-mentioned detector may be, for example, an angle sensor that detects the deployment angle of the monitor 2, or a photosensor that can detect the physical position of the monitor 2.

The same effect as above can be obtained when using one of these sensors, by detecting whether or not the monitor is in a deployed state.

(B)

In the above embodiment, an example was described in which the contact switch 16 that detected whether or not the monitor 2 was in a deployed state was provided to a face of the housing component 5, which was disposed along the ceiling 4 of the passenger compartment S. However, embodiments of the present invention are not limited to this.

For example, the contact switch may be provided on the monitor side.

In this case, when the monitor is moved to its fully closed state, the contact switch touches and hooks into the ceiling face (recessed state), which makes it easy to detect that the monitor is not in its deployed state, just as in the above embodiment.

(C)

In the above embodiment, the monitor housing apparatus 10 that opened and closed the substantially square (in plan view) monitor 2 was described. However, embodiments of the present invention are not limited to this.

For example, in addition to substantially square, the shape of the monitor that is opened and closed by this monitor housing apparatus can be polyhedral, circular, elliptical, or any of various other shapes.

Also, the monitor that is opened and closed need not be the above-mentioned LCD display panel, and may be any of various kinds of display panel.

(D)

In the above embodiment, an example was described of a housing device for the monitor 2 installed in a portion of the ceiling 4 of the passenger compartment S in a passenger aircraft, but embodiments of the present invention are not limited to a housing device for a monitor that is mounted in the passenger compartment of an aircraft.

For example, certain embodiments of the present invention can be similarly applied to a housing device for a monitor installed in a train, a bus, a passenger boat, or various other means of transport.

Alternatively, embodiments of the present invention are not limited to a housing device for a monitor installed in a means of transport, and can be broadly applied as a device for storing a monitor that is installed in a ceiling.

(E)

In the above embodiment, an example was described in which the power supply to the drive motor 22 was switched from the power supply 11 to the backup capacitor 13 by switching the three switches SW1 to SW3 on the basis of the detection result of the detection circuit 12. However, embodiments of the present invention are not limited to this.

Figure 9:
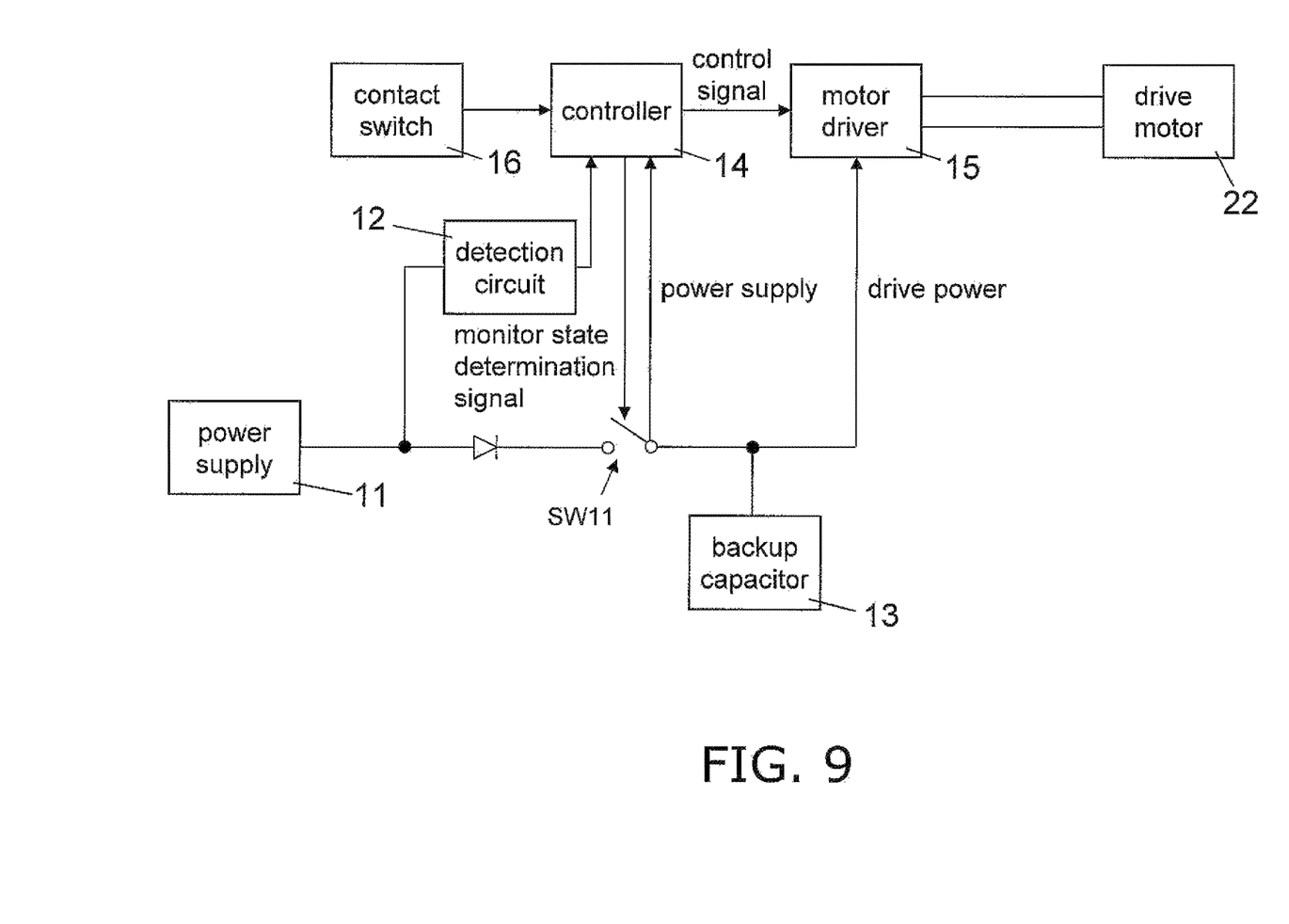
FIG. 9 is a control block diagram of the monitor housing apparatus pertaining to another embodiment of the present invention.

For example, as shown in FIG. 9, the number of switches can be reduced to just the one switch SW11 by supplying the power of the backup capacitor 13 to the motor driver 15.

(F)

In the above embodiment, an example was described in which no voltage was applied to the backup capacitor 13 in a state in which the monitor 2 was stowed, in order to extend the service life of the backup capacitor 13. However, embodiments of the present invention are not limited to this.

For example, if voltage is not actively applied in the stowed state of the monitor 2, the charge of the backup capacitor 13 will naturally decrease, but rather than waiting for the charge to naturally decrease, the charge may be actively released (discharged) to achieve a lower voltage state (a state with less charge storage).

This allows damage to the backup capacitor to be kept to a minimum, and more effectively extends the service life of the backup capacitor.

INDUSTRIAL APPLICABILITY

The monitor housing apparatus disclosed herein has the effect of allowing the service life of the capacitor installed for emergency power supply use to be extended as long as possible, without making the structure too complicated, and therefore can be broadly applied to housing devices for an opening and closing type of monitor.

The invention claimed is:

1. A monitor housing apparatus for storing a monitor in a stowed position, which monitor is installed in a housing component provided to the ceiling, in a state of being able to open and close, the monitor housing apparatus comprising:
   an opening and closing mechanism configured to turn the monitor around a rotation shaft that serves as the rotational center when the monitor is opened and closed;
   a drive motor configured to supply the opening and closing mechanism with drive force for opening and closing the monitor;
   a power supply configured to supply electrical power to the drive motor;
   a capacitor configured to supply the drive motor with emergency power for stowing away the monitor in the event that the supply of power from the power supply to the drive motor is shut off;
   a detector configured to detect when the monitor has been deployed; and
   a voltage application controller configured to apply voltage from the power supply to the capacitor when the detector detects that the monitor is in its deployed state, and halt the application of voltage from the power supply to the capacitor when the detector detects that the monitor is in its stowed state.

2. The monitor housing apparatus according to claim 1, wherein the detector includes a contact switch configured to detect a fully closed state of the monitor by coming into contact with part of the monitor in the fully closed state of the monitor.

3. The monitor housing apparatus according to claim 1, wherein the detector includes an angle sensor configured to sense the deployment angle of the monitor.

4. The monitor housing apparatus according to claim 1, wherein the detector includes a photosensor configured to sense the position of the monitor.

5. The monitor housing apparatus according to claim 1, further comprising
   a detection circuit configured to detect that the supply of power from the power supply to the drive motor has been cut off,
   wherein the voltage application controller controls the capacitor so that the capacitor provides an emergency power supply for moving the monitor to its closed state to the drive motor when the detection circuit detects that the power from the power supply has stopped and the detector detects that the monitor is in its deployed state.

6. A monitor housing apparatus according to claim 1, further comprising,
   a switch configured to switch on and off the application of voltage from the power supply to the capacitor based on a consequence of the detector.

* * * * *